United States Patent [19]

Kobayashi

[11] Patent Number: 5,596,186
[45] Date of Patent: Jan. 21, 1997

[54] HIGH SENSITIVITY SILICON AVALANCHE PHOTODIODE

[75] Inventor: Koji Kobayashi, Yokohama, Japan

[73] Assignee: Nikon Corporation, Tokyo, Japan

[21] Appl. No.: 354,731

[22] Filed: Dec. 6, 1994

[30] Foreign Application Priority Data

| Dec. 8, 1993 | [JP] | Japan | 5-308227 |
| Dec. 16, 1993 | [JP] | Japan | 5-316280 |
| Nov. 8, 1994 | [JP] | Japan | 6-273709 |
| Nov. 21, 1994 | [JP] | Japan | 6-286712 |

[51] Int. Cl.$^6$ .................................. H01J 40/14
[52] U.S. Cl. .......................... 250/214.1; 257/186
[58] Field of Search .................. 250/214.1, 214 LA; 257/186, 438, 189, 199, 443

[56] References Cited

U.S. PATENT DOCUMENTS

| 3,886,579 | 5/1975 | Ohuchi et al. | 357/13 |
| 4,840,916 | 6/1989 | Yasuda et al. | 257/438 |
| 4,949,144 | 8/1990 | Kuroda et al. | 257/186 |
| 5,021,854 | 6/1991 | Huth | 257/438 |

*Primary Examiner*—Que T. Le

[57] ABSTRACT

A silicon avalanche photodiode for ultraviolet light detection having a $p^+$-layer, an n-layer, an $n^-$-layer and an $n^+$-silicon substrate in the order from the entrance side of the ultraviolet light, wherein the $p^+$-layer has a thickness at least equal to $0.7/\alpha$ in which $\alpha$ is the absorption coefficient of silicon to the ultraviolet light. Also, a divided silicon avalanche photodiode provided with a photosensor array comprising plural light-receiving areas arranged in a matrix and having a guard ring only at the external periphery of the photosensor array.

9 Claims, 8 Drawing Sheets

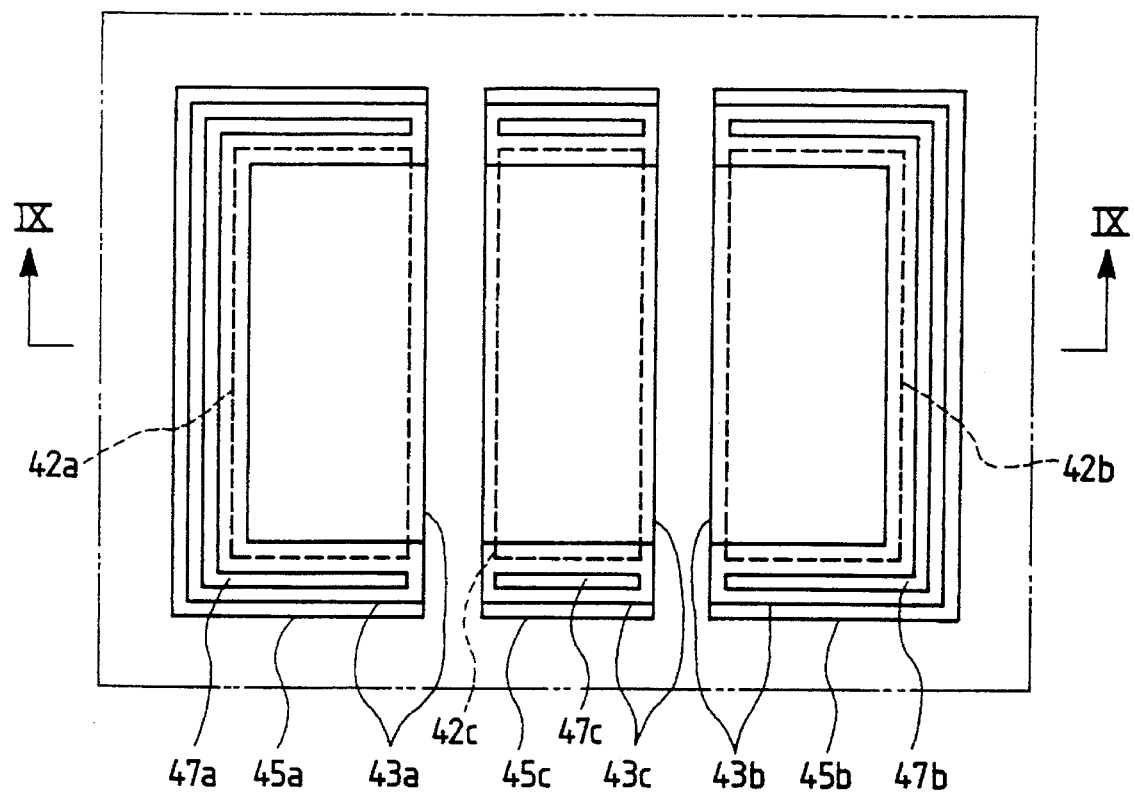
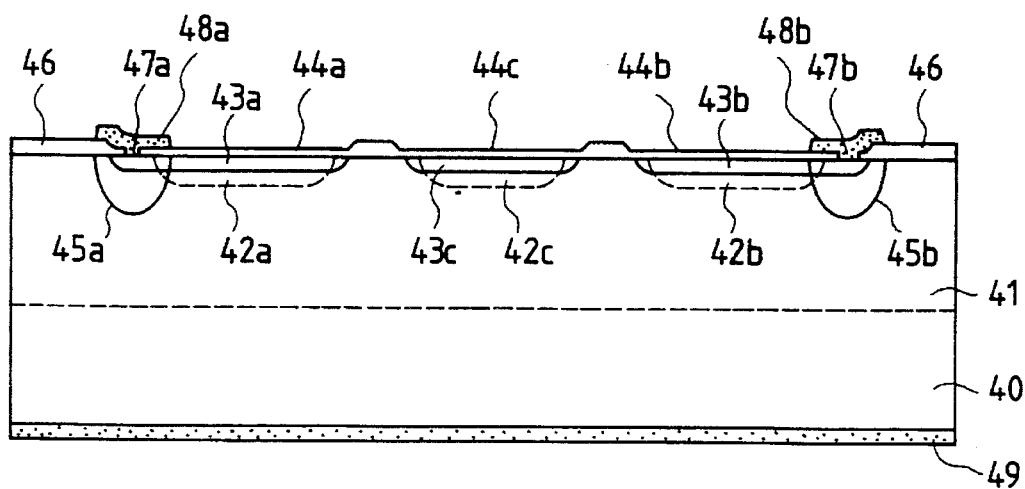

HIGH SENSITIVITY SILICON AVALANCHE PHOTODIODE

BACKGROUND OF THE INVENTION

1. Field of the Invention

The present invention relates to a silicon avalanche photodiode.

2. Related Background Art

The avalanche photodiode (hereinafter abbreviated as APD) is a semiconductor photosensor device capable of light detection, and is excellent in the detection of very weak light requiring high-speed response, utilizing amplification by an avalanche phenomenon in the semiconductor.

The avalanche phenomenon is induced by introducing carriers, generated by a photoelectric effect in a light-receiving area, into a high electric field area formed in a semiconductor pn junction. The carriers introduced in such high electric field area collide with neutral semiconductor atoms, thus generating other carriers. Such newly generated carriers collide with other neutral atoms to further generate new carriers, and the carriers repeat collisions in this manner. Thus, the APD achieves amplification of the limited carriers obtained by the photoelectric effect, utilizing the avalanche phenomenon. Stated differently, it amplifies the light signal current by ionization of neutral atoms.

The high electric field area is generated by the application of reverse-bias voltages of about 100 V to a pn junction. However, such a high electric field, generated in the semiconductor, tends to cause an edge breakdown at the end portion of the pn junction, and such edge breakdown hinders the avalanche phenomenon in the light-receiving area. Various structures have been proposed to prevent such edge breakdown, but, in the APD utilizing the known planar technology, the edge breakdown is usually prevented by the formation of a guard ring along the perimeter of the pn junction.

The conventional silicon APD, recently employed as the photosensor device for optical communication system, has a cross-sectional structure as shown in FIG. 10. Such a silicon APD, designed generally for infrared light of 800 nm to 900 nm, is provided with doped areas of $n^+$-p-$p^-$-$p^+$ from the entrance side of the infrared light, and such a structure has sufficient sensitivity to the light of the above-mentioned spectral region. Around the $n^+$-layer 53 and a p-layer 52, there is formed a guard ring 55 consisting of an $n^-$ or n diffusion area. An electrode 58 is connected to the guard ring 55 through a contact hole 57, and, around the guard ring 55, there is formed an inversion preventing diffusion layer 60 (hereinafter called "channel cut") consisting of a p-diffusion area. An antireflection film 54 is formed on an $n^+$-diffusion layer 53, and a $SiO_2$ protective film 56 is formed around the light-receiving area. An epitaxially grown $p^-$-layer 51 is formed on a $p^+$-silicon substrate 50, and an electrode 59 is formed on the bottom face of said substrate 50. High reverse-bias voltages of about 100 V is applied between the $n^+$-diffusion layer 53 and the $p^+$-silicon substrate 50 through the electrodes 58, 59, thereby forming a high electric field area. The entering infrared light is subjected to the photoelectric effect, and the resulting carriers enter the high electric field area. Said carriers collide with neutral semiconductor atoms to generate other carriers. The thus formed new carriers collide with other neutral atoms, thus generating further new carriers. In this manner the carriers repeat collision, and the entered infrared light is generally amplified 100 times or more.

When a $SiO_2$ film is formed on a $p^-$-layer with a low impurity concentration, said $p^-$-layer which surface is inverted into an n-semiconductor layer, and the channel cut 60 is provided for preventing such inversion.

With the recent advances in the field, there is increasingly required a silicon avalanche photodiode with a photosensor array, consisting of a matrix array of plural photosensor areas (hereinafter called "divided silicon APD"). Such an APD device enables, for example, the positional measurement of very weak light, thus improving the performance of measuring equipment.

In the following there will be explained a conventional divided silicon APD, with reference to FIGS. 12 and 13 illustrating a two-divided silicon APD. On a $p^+$-silicon substrate 70 with a high $p^+$-impurity concentration, there is provided a $p^-$-layer 71 of a low impurity concentration, which is generally formed by epitaxial growth. In said $p^-$-layer 71, there are formed $n^+$-layers 73a, 73b of a high n-impurity concentration serving as the light-receiving areas, and p-layers 72a, 72b provided thereunder for forming the high electric field areas. Antireflective films 74a, 74b are respectively formed on the $n^+$-layers 73a, 73b constituting the light-receiving areas, and n-type guard rings 75a, 75b are respectively formed therearound. Consequently the guard rings 75a, 75b respectively surround the edges of the pn junctions, thereby preventing the edge breakdown. Around the guard rings 75a and 75b, there is formed a channel cut 80 consisting of a p-diffused area.

The light-receiving areas independently detect the light. For this purpose, in an area sandwiched between the neighboring light-receiving areas consisting of the $n^+$-layers, there is formed an isolation area 81a including the channel cut 80. Also in said sandwiched area, there exists the guard rings 75a, 75b 0in addition to said isolation area 81a.

On the surface there is formed a protective film 76, which is partially removed, on the guard rings 75a, 75b, to constitute contact holes 77a, 77b respectively having electrodes 78a, 78b therein. Another electrode 79 is formed on the bottom face of the $p^+$-silicon substrate 70.

The isolation area 81a and the guard rings 75a, 75b are low in sensitivity of light detection, and are called an insensitive zone 81b. Preferably the width of said insensitive zone 81b should be made as small as possible, because a smaller width is advantageous for improving the resolving power. More specifically, if the incident light is formed as a spot of a diameter of about 0.5 mm and if the width of said insensitive zone is 0.5 mm or larger, the signal current is not generated when the light spot falls on the insensitive zone. Consequently a small light spot cannot be used when the width of the insensitive zone is large, but the use of a larger light spot, for example, in the positional detection, deteriorates the resolving power.

There has not been proposed a silicon APD for ultraviolet detection, capable of detecting weak ultraviolet light with a high-speed response, and the conventional silicon APD cannot provide a sufficient gain in the ultraviolet light detection. Also there are generated significant noises, so that the S/N ratio, which is the ratio of the signal component to the noise component in the output signal, cannot be made high.

Also, in the conventional divided silicon APD, the above-mentioned width of the insensitive zone is significantly larger than that in other divided photosensor devices such as the PN photodiode or the PIN photodiode, so that the resolving power is significantly worse.

SUMMARY OF THE INVENTION

An object of the present invention is to provide a silicon APD for ultraviolet detection, capable of providing a sufficiently high gain even for the ultraviolet light and a satisfactory S/N ratio.

Another object of the present invention is to provide a divided silicon APD with improved resolving power.

The above-mentioned objects can be attained, according to an aspect of the present invention, by an ultraviolet detecting silicon APD which is provided, in the order from the entrance side of the ultraviolet light, a $p^+$-layer, an n-layer, an $n^-$-layer and an $n^+$-silicon substrate, wherein said $p^+$-layer has a thickness at least equal to $0.7/\alpha$ in which a is the absorption coefficient of silicon to the ultraviolet light.

As a result of intensive research, the present inventors have found that the sensitivity to the ultraviolet light can be significantly improved when the silicon APD has a layered structure of $p^+$-n-$n^-$$n^+$ in the order from the entrance side of the ultraviolet light. It has also been found that the sensitivity is further improved if the $p^+$-layer has a thickness at least equal to $0.7/\alpha$ wherein a is the absorption coefficient of silicon to the ultraviolet light, and the present invention has thus been reached. The absorption coefficient, per unit length, is defined by the following equation (1):

$$I = I_0 \times \exp(-\alpha x) \qquad (1)$$

wherein $I_0$ is the amount of incident ultraviolet light, I is the amount of ultraviolet light after absorption, and x is the travelling distance of the ultraviolet light.

The APD is a semiconductor photosensor device for amplifying the photocurrent by introducing carriers, generated from the incident light by the photoelectric effect, into a high electric field area formed in a pn junction area, thereby inducing an avalanche phenomenon. The avalanche phenomenon is closely related with the ionization rate of the semiconductor substance in which the high electric field area is formed, and, in the case of silicon, the ionization rate of electrons is higher than that of holes. Consequently, the avalanche phenomenon can be induced more efficiently, among the charged carriers generated by the photoelectric effect, by the injection of the electrons, rather than the injection of the holes, into the high electric field area, and the noises can be made lower in this manner.

The commercially available silicon APD's are generally designed for receiving the infrared light, but those for receiving the ultraviolet light have not been realized because the ultraviolet light sources generally have a high intensity, such as the mercury lamp, He—Cd laser and excimer laser, so that such ultraviolet light need not be received, in most cases, by the silicon APD. However, the recent advances in various scienctic fields have created the requirement for receiving very weak ultraviolet light, such as the observation of the fluorescent light generated by living organisms. For such application there has been utilized the silicon APD for infrared light or the photomultiplier tube. However, such conventional silicon APD for infrared light, if applied to the detection of the ultraviolet light, cannot provide a sufficient gain, and can only give a low S/N ratio. On the other hand, the photomultiplier tube, though providing a high gain even to the ultraviolet light, requires a large device volume including the photomultiplier tube itself, and is associated with a low S/N ratio.

In the following there will be calculated, when the light enters silicon, the distance required for 95% of said light to be absorbed. The absorption coefficient is $1.02 \times 10^3$ cm$^{-1}$ at a wavelength of 800 nm, $3.4 \times 10^4$ cm$^{-1}$ at a wavelength of 430 nm, and $1.06 \times 10^6$ cm$^{-1}$ at a wavelength of 360 nm. The distance required for absorption of 95% of the incident light can be determined by substitution of $I/I_0 = (1-0.95)$ in the foregoing equation (1). Consequently there is obtained a relation $x = (3/\alpha)$, so that the above-mentioned distance becomes 29 µm at 800 nm, or 0.9 µm at 430 nm, or 0.03 82 m at 360 nm.

In the following, there will be explained why the conventional silicon APD cannot achieve sufficient amplification of the ultraviolet light. In the conventional silicon APD with the aforementioned $n^+$-p-$p^-$-$p^+$ structure, the infrared light with the wavelength of 800 nm is mostly absorbed in the p- and $p^-$-layers, while the ultraviolet light of 430 nm or 360 nm is absorbed in the $n^+$-layer. Consequently, in the conventional silicon APD designed for the infrared light, the carriers injected in the high electric field area created by the p- and $p^-$-layers are the electrons which are minority carriers of the p- and $p^-$-layers if the incident light is in the infrared region, but are the holes which are minority carriers of the $n^+$-layer if the incident light is in the ultraviolet region. FIG. 11 is a chart showing the spectral sensitivity distribution of the conventional silicon APD of which sensitivity is highest in a wavelength region from 850 nm to 900 nm but is low in the ultraviolet region.

Therefore, if the incident light is ultraviolet light, the electrons that can efficiently induce the avalanche phenomenon cannot be injected into the high electric field area. For this reason the conventional silicon APD cannot provide a sufficiently high gain and is associated with a low S/N ratio.

The present invention adopts the $p^+$-n-$n^-$-$n^+$ structure, in order to enable injection of the electrons into the high electric field area. This structure realizes injection of the electrons, instead of holes, into the high electric field area even when the ultraviolet light of 430 nm or 360 nm enters the silicon APD, thereby enabling to efficiently induce the avalanche amplification.

In the following there will be given an explanation on the thickness of the $p^+$-layer. Most preferably the photosensor device should be capable of absorbing 100% of the incident light. It has however been found, as a result of intensive research, that the $p^+$-n-$n^-$-$n^+$ structure in the silicon APD provides a sufficient gain and achieves an improvement in the S/N ratio even when only 50% of the incident light is absorbed in the $p^+$-layer. The distance required for absorption of 50% of the incident light can be determined by substitution of $I/I_0 = (1-0.5)$ into the equation (1), and corresponds to $x = (0.7/\alpha)$.

According to a second aspect of the present invention, there is provided a silicon APD provided with a photosensor array comprising of plural light-receiving faces arranged in a matrix, said silicon APD being featured by a fact that the guard ring is provided only at the external periphery of the photosensor array.

In this structure, the area sandwiched between the mutually neighboring light-receiving areas within the photosensor array is rendered as a depletion layer during the function of the silicon APD.

In the conventional multi-divided silicon APD, a guard ring is provided in an area sandwiched between the mutually neighboring light-receiving areas, so that the width of the insensitive zone is significantly large. The present invention has been reached by a finding that the edge breakdown can be prevented even when the guard ring is eliminated in the area sandwiched between the mutually neighboring light-receiving areas.

By eliminating the guard ring in the area sandwiched between the mutually neighboring light-receiving areas and by rendering said area as a depletion layer during the function of the silicon APD, the concentration of the electric field can be relaxed at the end of the pn junction. For this reason, the edge breakdown does not occur when the light-receiving areas are arranged in a mutually close manner, even in the absence of the guard rings at the perimeters of the light-receiving areas in the zone therebetween. Also owing to the absence of the guard rings, the width of the insensitive zone can be reduced to the order of tens of microns, as generally is the case in the photosensor devices such as the PN photodiode or PIN photodiode.

This situation will be explained with reference to FIGS. 14 and 15, which are schematic cross-sectional views showing the electric field distribution in the silicon APD without the guard ring. FIG. 14 illustrates an isolated single light-receiving area. A semiconductor layer 91 of a first conductive type (for example p) and a semiconductor layer 92 of a second conductive type (for example n) constituting the light-receiving areas are given a high inverse bias voltage to generate a high electric field areas, whereby depletion layers 93, 94 are formed therebetween. The depletion layer 93 is formed in a flat area at the center of the light-receiving area, and is present between the mutually parallel semiconductor layers 91, 92 of same areas, positioned thereon and thereunder. For this reason the lines of electric force within the depletion layer 93 become mutually parallel. The depletion layer 94 is in the peripheral curved area, and, because of the curved form, has different semiconductor areas on both sides. Said areas respectively correspond to the length of a curve b–c and that of a curve e–f in FIG. 14. For this reason, the lines of electric force within the depletion layer 94 become denser in a direction from the semiconductor layer 91 to the semiconductor layer 92. Thus the electric field become higher in the depletion-layer 94 than in the depletion-layer 93, and the edge breakdown tends to occur in such curved area.

FIG. 15 illustrates an area around mutually neighboring two light-receiving areas. Since the illustrated configuration is symmetrical with respect to the central line D—D, the following explanation will only be given to the situation at the left-hand side. A semiconductor layer 95 of a first conductive type (for example p) and semiconductor layers 96, 99 of a second conductive type (for example n) constituting light-receiving areas are given a high inverse bias voltage for generating a high electric field area. The semiconductor layers 96 and 99 receive a same voltage. As a result, depletion layers 97, 98 are formed between said semiconductor layers. The depletion layer 97 is formed in a flat area at the center of the light-receiving area, and is present between the mutually parallel semiconductor layers 95, 96 of same areas, positioned thereunder and thereon. For this reason the lines of electric force within the depletion layer 97 become mutually parallel. The depletion layer 98 is in the peripheral curved area, and, because of the curved form, has different semiconductor areas on both sides. Said areas respectively correspond to the length of a curve g–h and that of a curve i–j in FIG. 15. For this reason the lines of electric force within the depletion layer 98 become denser in a direction from the semiconductor layer 95 to the semiconductor layer 96. However, as will be apparent from a comparison with FIG. 14, the difference in the areas of the semiconductor layers on both sides of the depletion layer is smaller than that in the depletion layer 94. This situation is represented by a fact that the curve e–f is shortened to the curve i–j. For this reason the concentration of the lines of electric force at g–h is relaxed and the edge breakdown can be prevented. However, the relaxation of the concentration of the electric field in this case does not reach the level of relaxation in the case the pn junction is flat. Consequently the p-diffused area needs to be positioned inside the light-receiving area, and the width of the insensitive zone in this structure becomes equal to the distance between the p-diffused areas. In this manner, the width of the insensitive zone of the divided silicon APD can be made as small as several tens of microns.

In case a $SiO_2$ film is formed on the $n^-$-layer of a low impurity concentration, the channel cut can be dispensed with, as the $n^-$-layer is merely different in concentration from the n-layer.

According to a third aspect of the present invention, there is provided a silicon APD for ultraviolet light detection, provided with a photosensor array comprising plural light-receiving areas arranged in a matrix, said silicon APD being featured by a structure having a $p^+$-layer, an n-layer, an $n^-$-layer and an $n^+$-silicon substrate in the order from the entrance side of the ultraviolet light, and by a fact that the $p^+$-layer has a thickness at least equal to $0.7/\alpha$ in which $\alpha$ is the absorption coefficient of silicon to the ultraviolet light, and that the guard ring is provided only at the external periphery of the photosensor array.

In this structure, the area sandwiched between the mutually neighboring light-receiving areas within the photosensor array is rendered as a depletion layer during the function of the silicon APD.

The foregoing and other objects, features and advantages of the present invention are explained hereinafter and may be better understood by reference to the drawings and the descriptive matter which follows.

BRIEF DESCRIPTION OF THE DRAWINGS

FIG. 8 is a plan view of a fifth embodiment of the silicon APD of the present invention;

FIG. 9 is a cross-sectional view along a line IX—IX in FIG. 8;

FIGS. 14 and 15 are schematic cross-sectional views showing the electric field distribution in a silicon APD in which the guard ring is dispensed with.

DETAILED DESCRIPTION OF THE PREFERRED EMBODIMENTS

Figure 1:
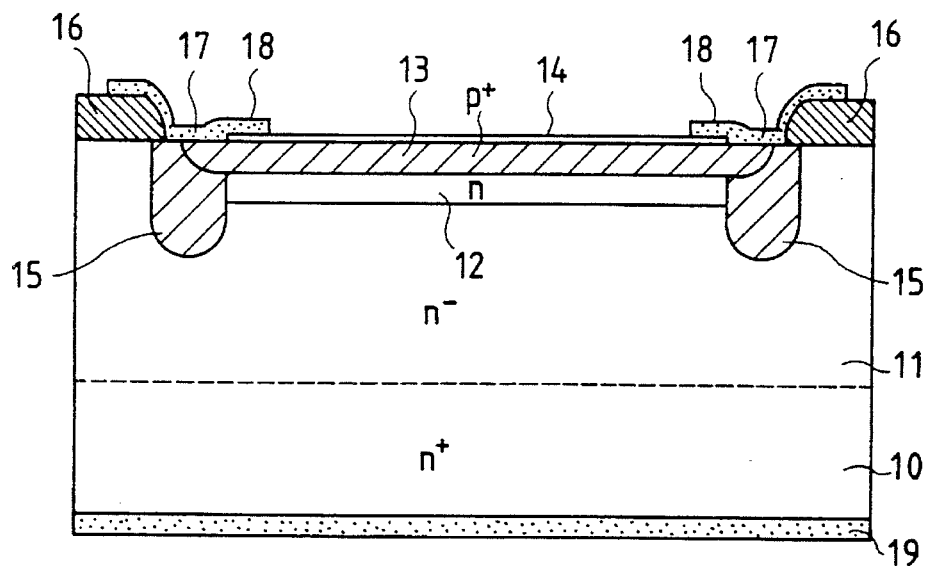
FIG. 1 is a cross-sectional view of a first embodiment of the silicon APD of the present invention.

FIG. 1 is a cross-sectional view of a first embodiment of the present invention, designed for detecting the ultraviolet light of a wavelength of 360 nm to 430 nm and provided with a $p^+\text{-}n\text{-}n^-\text{-}n^+$ structure from the entrance side of the ultraviolet light. The $n^+$-silicon substrate 10 has an impurity concentration of $2\times10^{17}$ cm$^{-3}$. On said silicon substrate 10 there is formed an epitaxial growth layer 11 of a thickness of 25 μm, with an impurity concentration of $1\times10^{14}$ cm$^{-3}$. An n-layer 12 is formed by phosphor diffusion, with an impurity concentration of $1.2\times10^{16}$ cm$^{-3}$ and a diffusion depth (xj) of 2.5 μm from the substrate surface. A $p^+$-layer 13, constituting the light-receiving area, is formed by boron diffusion, with an impurity concentration of $1\times10^{19}$ cm$^{-3}$ and xj of 0.2 μm. This diffusion depth corresponds to $0.7/\alpha$ or larger for the ultraviolet light of 360 nm to 430 nm. On said $p^+$-layer 13 there is formed an antireflective film 14 of SiO$_2$, of which thickness of 600 Å is sufficiently transparent to the ultraviolet light. Along the periphery of the $p^+$-layer 13 there is provided a guard ring 15 consisting of a p-diffused layer formed by boron diffusion. Also, a protective film 16 consisting of SiO$_2$ is formed on the surface, and a part of said protective film 16 is eliminated to form a contact hole 17 between the antireflective film 14 and the protective film 16. An aluminum electrode 18 is provided in said contact hole 17, so as to contact the $p^+$-layer 13 and the guard ring 15. Another aluminum electrode 19 is provided on the bottom face of the $n^+$-silicon substrate 10. The amplified signal (charge) is taken out from the electrode 18.

Figure 2:
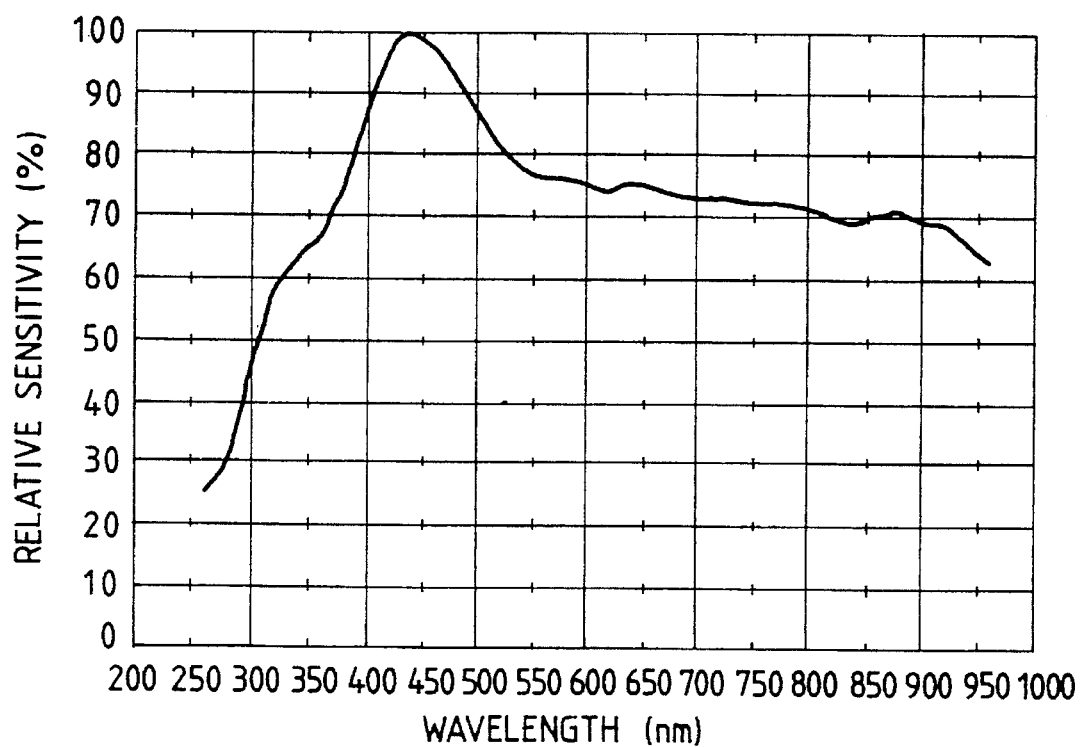
FIG. 2 is a chart showing the relative spectral sensitivity distribution of the silicon APD shown in FIG. 1.
Figure 11:
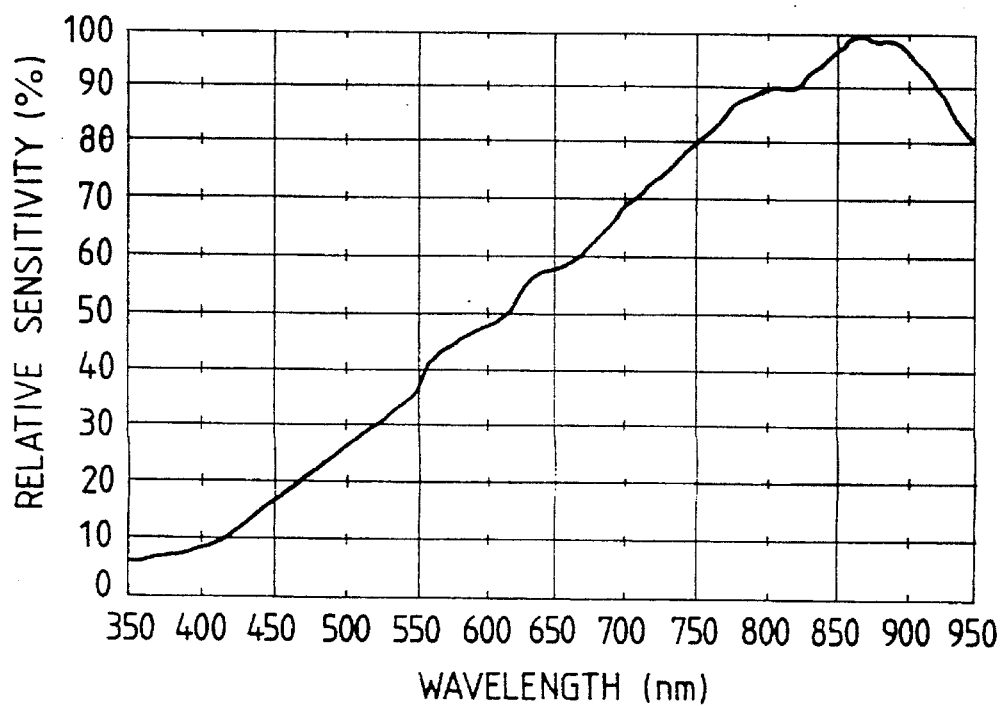
FIG. 11 is a chart showing the relative spectral sensitivity distribution of the silicon APD shown in FIG. 10.
Figure 12:
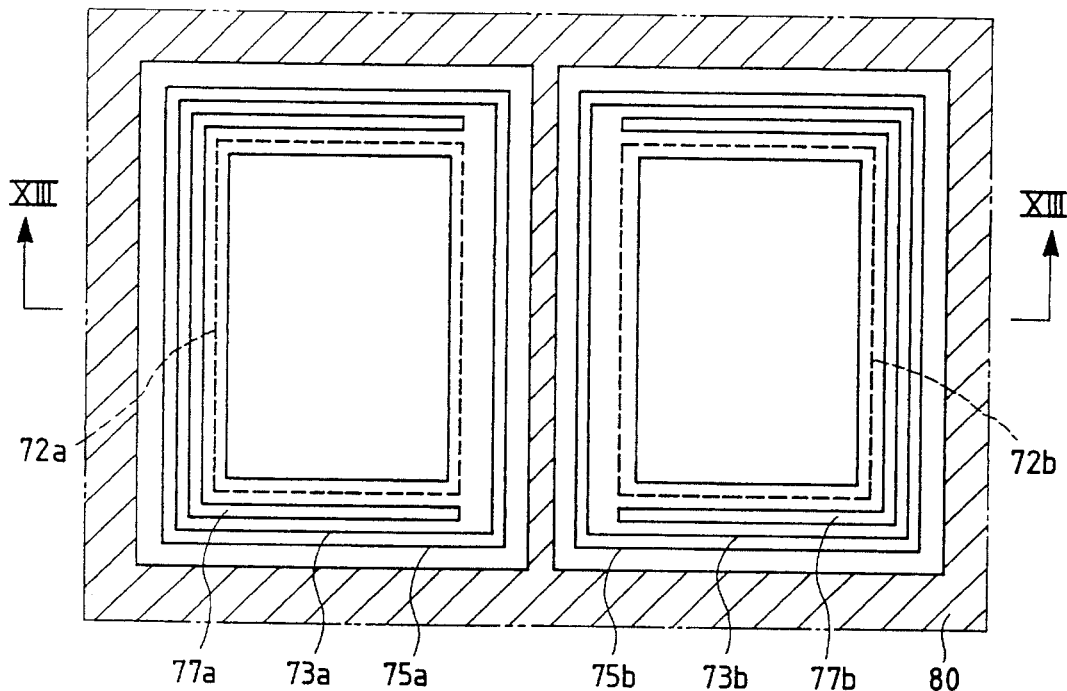
FIG. 12 iS a plan view of a conventional two-divided silicon APD.
Figure 13:
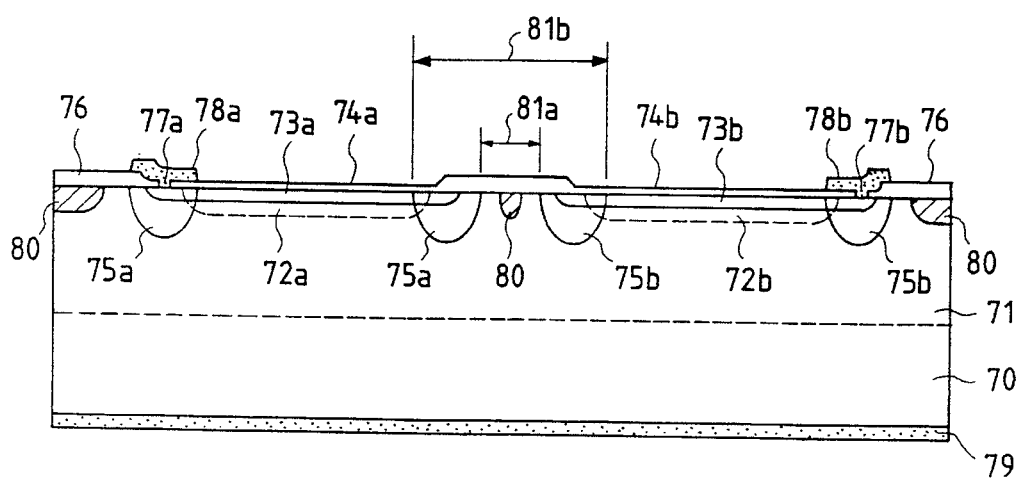
FIG. 13 is a cross-sectional view along a line XIII—XIII in FIG. 12.
Figure 14:
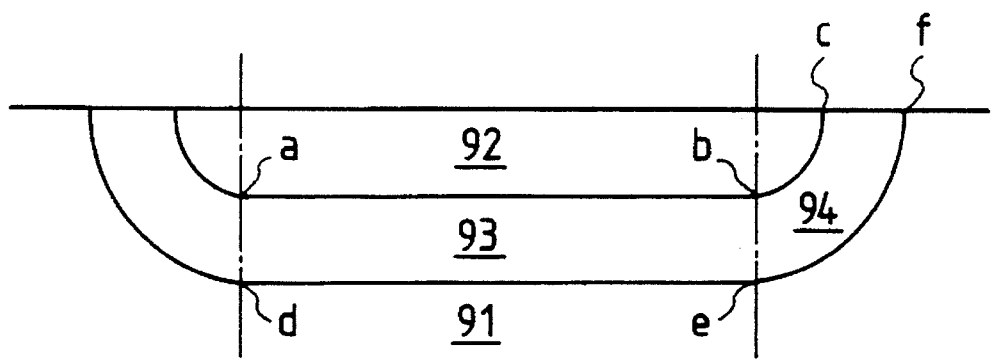
Figure 15:
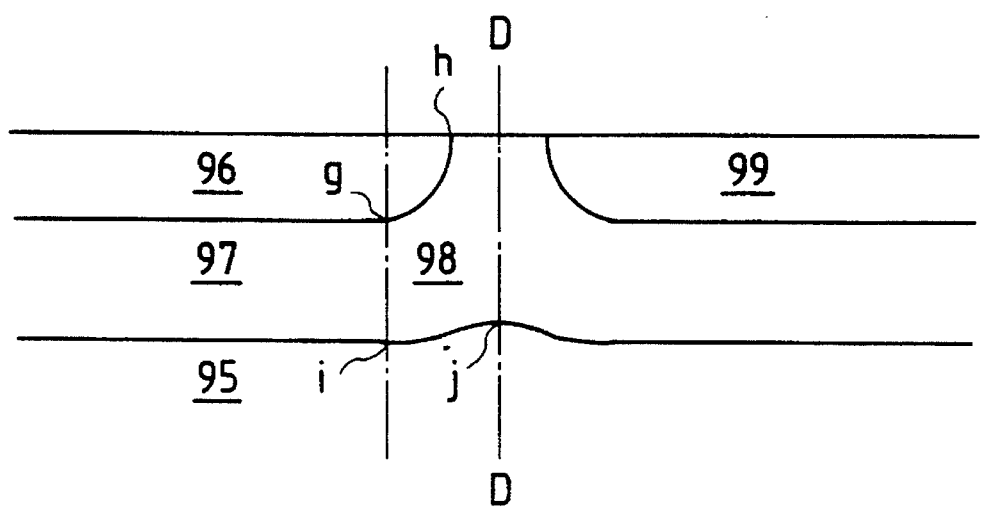

FIG. 2 is a chart showing the relative spectral sensitivity distribution of the ultraviolet-detecting silicon APD shown in FIG. 1. The maximum sensitivity is positioned between 400 nm and 500 nm, and the sensitivity in the ultraviolet region is improved in comparison with that of the conventional silicon APD (cf. FIG. 11).

The magnitude of noise is variable depending on the gain, but, in comparison with the noise in the conventional silicon APD, it is 1/2.05 times at a gain of 20 times, 1/2.21 times at a gain of 40 times, and 1/1.74 times at a gain of 100 times.

Figure 3:
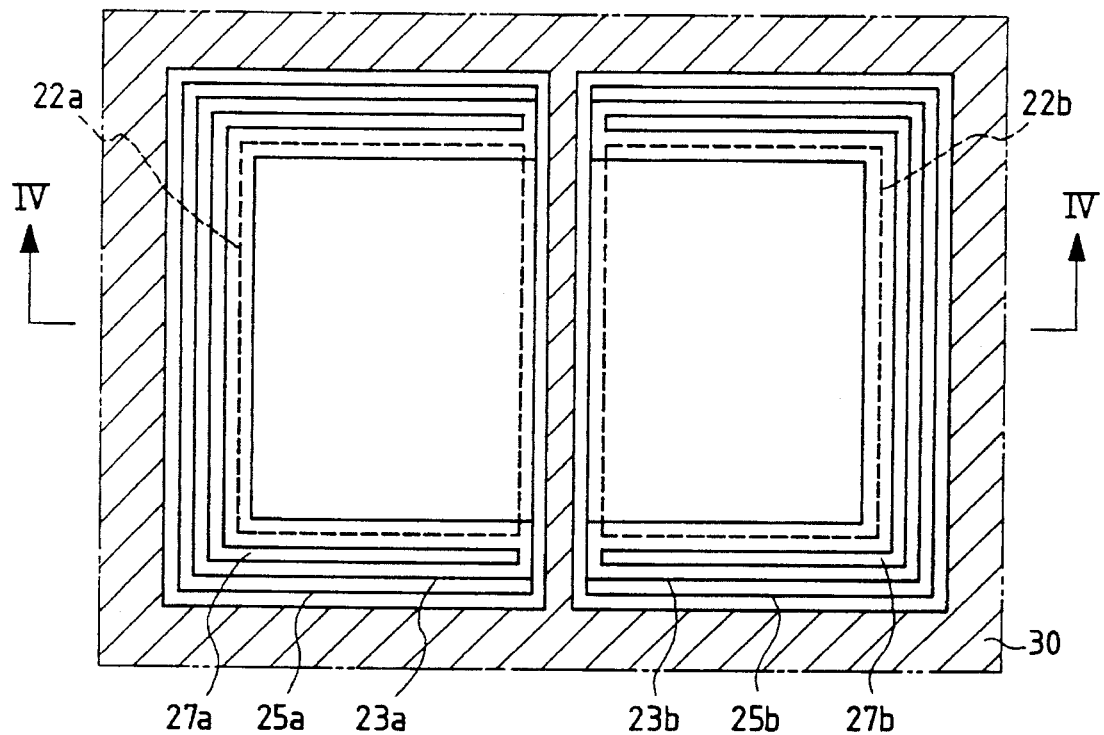
FIG. 3 is a plan view of a second embodiment of the silicon APD of the present invention.
Figure 4:
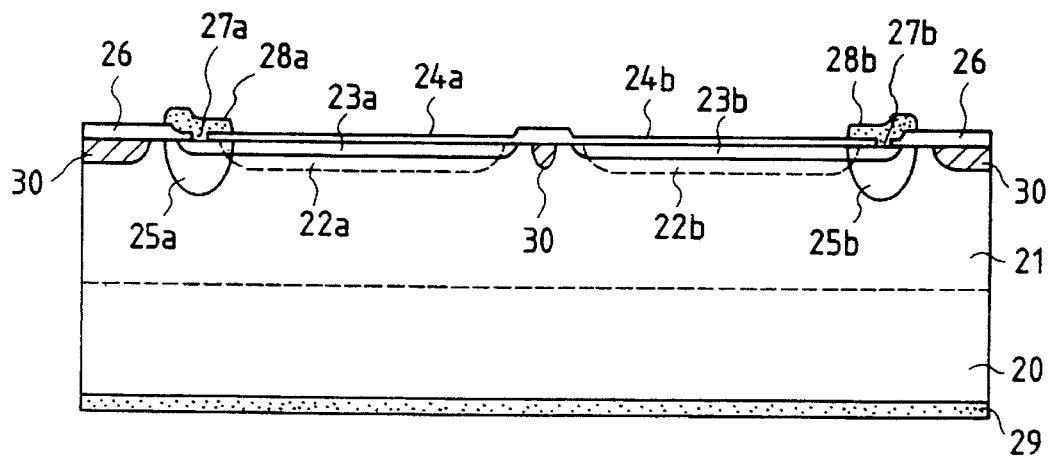
FIG. 4 is a cross-sectional view along a line IV—IV in FIG. 3.

FIGS. 3 and 4 illustrate a second embodiment of the silicon APD of the present invention, which is a two-divided silicon APD provided with a photosensor array comprising two light-receiving areas. On a $p^+$-silicon substrate 20 with an impurity concentration of $2\times10^{15}$ cm$^{-3}$, an epitaxially grown $p^-$-layer 21 is formed with a thickness of 25 μm and an impurity concentration of $1\times10^{14}$ cm$^{-3}$. In said epitaxially grown layer 21, there are formed, according to the present invention, guard rings 25a, 25b consisting of n-diffused layers formed by phosphor diffusion, p-diffusion layers 22a, 22b formed by boron diffusion and provided for forming high electric field areas, and $n^+$-diffusion layers 23a, 23b formed by arsenic diffusion and provided for forming pn junctions, wherein the $n^+$-diffusion layers 23a, 23b constitute the light-receiving areas. On the epitaxially grown layers, there is formed a channel cut 30 consisting of a p-diffusion area.

As will be apparent from FIG. 3, the guard rings 25a, 25b are formed, according to the present invention, on the external periphery of the photosensor array consisting of the two light-receiving areas or the $n^+$-diffusion layers 23a, 23b. In other words, a guard ring is not provided in the area between the mutually neighboring light-receiving areas. These guard rings 25a, 25b have a diffusion depth (xj) of ca. 5.0 μm and a sheet resistance (Rs) of 110Ω/square, and serve to relax the concentration of the line of electric force at the edge portion.

The p-diffusion layers 22a, 22b for forming the high electric field areas have xj of 2.2 μm and Rs of 5.1 kΩ/square, and serve to control the operating voltage. This second embodiment provides a gain of 100 times with a reverse-bias voltages of 100 V.

The $n^+$-diffusion layers 23a, 23b for forming the pn junctions and constituting the light-receiving areas have xj of 0.2 μm and Rs of 180Ω/square, and are positioned with a distance of 14 μm therebetween. The epitaxially grown layer 21 forms a depletion layer of a width of about 36 μm at an impurity concentration of $1\times10^{14}$ cm$^{-3}$ and under an inverse bias voltage of 100 V, so that the epitaxially grown layer between the $n^+$-diffusion layers 23a and 23b is completely depleted.

These $n^+$-diffusion layers are so formed as to partially overlap with the guard rings, with an overlapping amount of 16 μm in the present embodiment.

On the $n^+$-diffusion layers there are formed antireflective layers 24a, 24b having a thickness of 600 Å and consisting of SiO$_2$. Also, a protective film 26, consisting of SiO$_2$, is formed on the surface.

The antireflective films 24a, 24b are partially eliminated, on the guard rings 25a, 25b, to constitute contact holes 27a, 27b in which aluminum electrodes 28a, 28b are provided. Another electrode 29 is formed also on the $p^+$-substrate 20. These electrodes may naturally be composed of gold.

Figure 5:
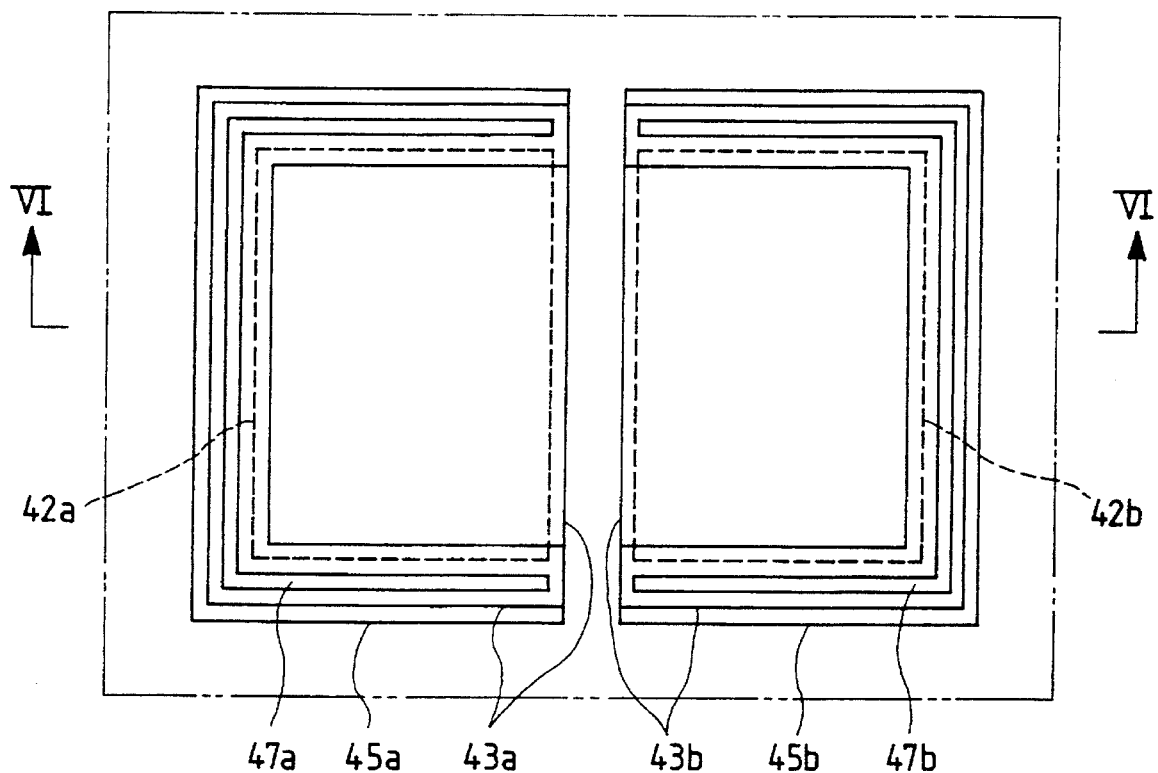
FIG. 5 is a plan view of a third embodiment of the silicon APD of the present invention.
Figure 6:
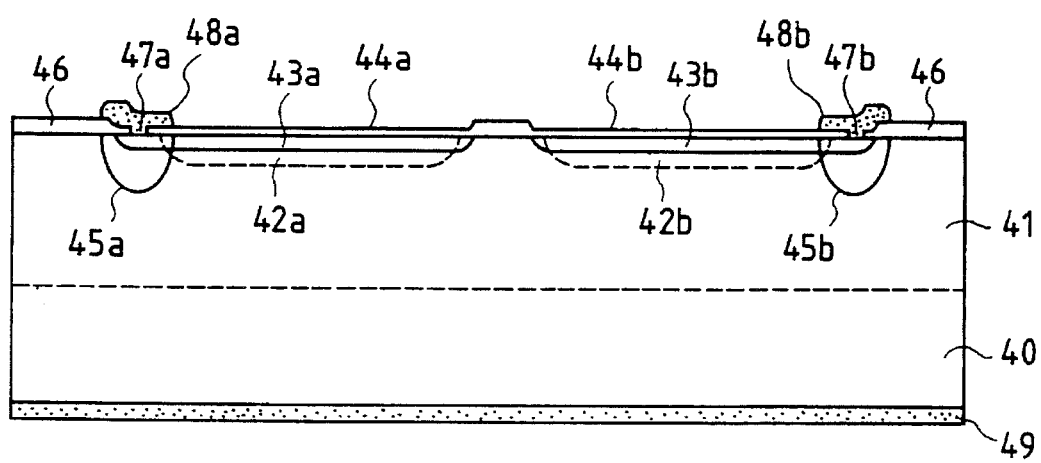
FIG. 6 is a cross-sectional view along a line VI—VI in FIG. 5.

FIGS. 5 and 6 illustrate a third embodiment of the silicon APD of the present invention, which is a two-divided silicon APD for ultraviolet light detection, provided with a photosensor array consisting of two light-receiving areas. On an $n^+$-silicon substrate 40 with an impurity concentration of $2\times10^{17}$ cm$^{-3}$, an $n^-$-epitaxially grown layer 41 is formed with a thickness of 25 μm and an impurity concentration of $1\times10^{14}$ cm$^{-3}$. In said epitaxially grown layer 41, there are formed, according to the present invention, guard rings 45a, 45b consisting p-diffusion layers formed by boron diffusion, n-diffusion layers 42a, 42b formed by phosphor diffusion for forming high electric field areas, and $p^+$-diffusion layers 43a, 43b formed by boron diffusion for forming the pn junctions, wherein the $p^-$-diffusion layers 43a, 43b constitute the light-receiving areas.

As will be apparent from FIG. 5, the guard rings 45a, 45b are formed, according to the present invention, only on the external periphery of the photosensor array consisting the two light-receiving areas or the $p^+$-diffusion layers 43a, 43b. In other words, a guard ring is not provided in the area between the mutually neighboring light-receiving areas. These guard rings 45a, 45b have a diffusion depth (xj) of ca. 6 μm and a sheet resistance (Rs) of 240 Ω/square, and serve to relax the concentration of the lines of electric force at the edge portion.

The n-diffusion layers 42a, 42b, for forming the high electric field areas, have xj of 2.1 μm and Rs of 2 kΩ/square, and allow to control the operating voltage. This third embodiment provides a gain of 100 times under reverse-bias voltages of 100 V.

The $p^+$-diffusion layers 43a, 43b for forming the pn junctions and constituting the light-receiving areas, have xj of 0.2 μm and Rs of 180 Ω/square, and are positioned with a distance of 14 μm therebetween. The epitaxially grown layer 41 forms a depletion layer of a width of about 36 μm with an impurity concentration of $1\times10^{14}$ cm$^{-3}$ and under an inverse bias voltage of 100 V, so that the epitaxially grown layer between the $p^+$-diffusion layers 43a and 43b is completely depleted. Also, the diffusion depth (xj) of 0.2 μm corresponds to $0.7/\alpha$ or larger for the light of a wavelength of 430 nm or shorter.

These $p^+$-diffusion layers are so formed as to partially overlap with the guard rings, with an overlapping amount of 16 μm in the present embodiment.

On the $p^+$-diffusion layers there are formed antireflective films 44a, 44b consisting of SiO$_2$ and having a thickness of 600 Å, a sufficient transparency to the ultraviolet light. Also, a protective film 46 consisting of SiO$_2$ is formed on the surface.

The antireflective films 44a, 44b are partially eliminated, on the guard rings 45a, 45b, to constitute contact holes 47a, 47b in which aluminum electrodes 48a, 48b are provided. Another aluminum electrode 49 is provided on the n$^+$-substrate 40.

A variation of the silicon APD of the third embodiment, wherein the n-diffusion layers have xj of 2.0 µm and Rs of 2.1 kΩ/square, showed a gain of 100 times to the ultraviolet light of 365 nm under a bias voltage of ca. 160 V.

Figure 7:
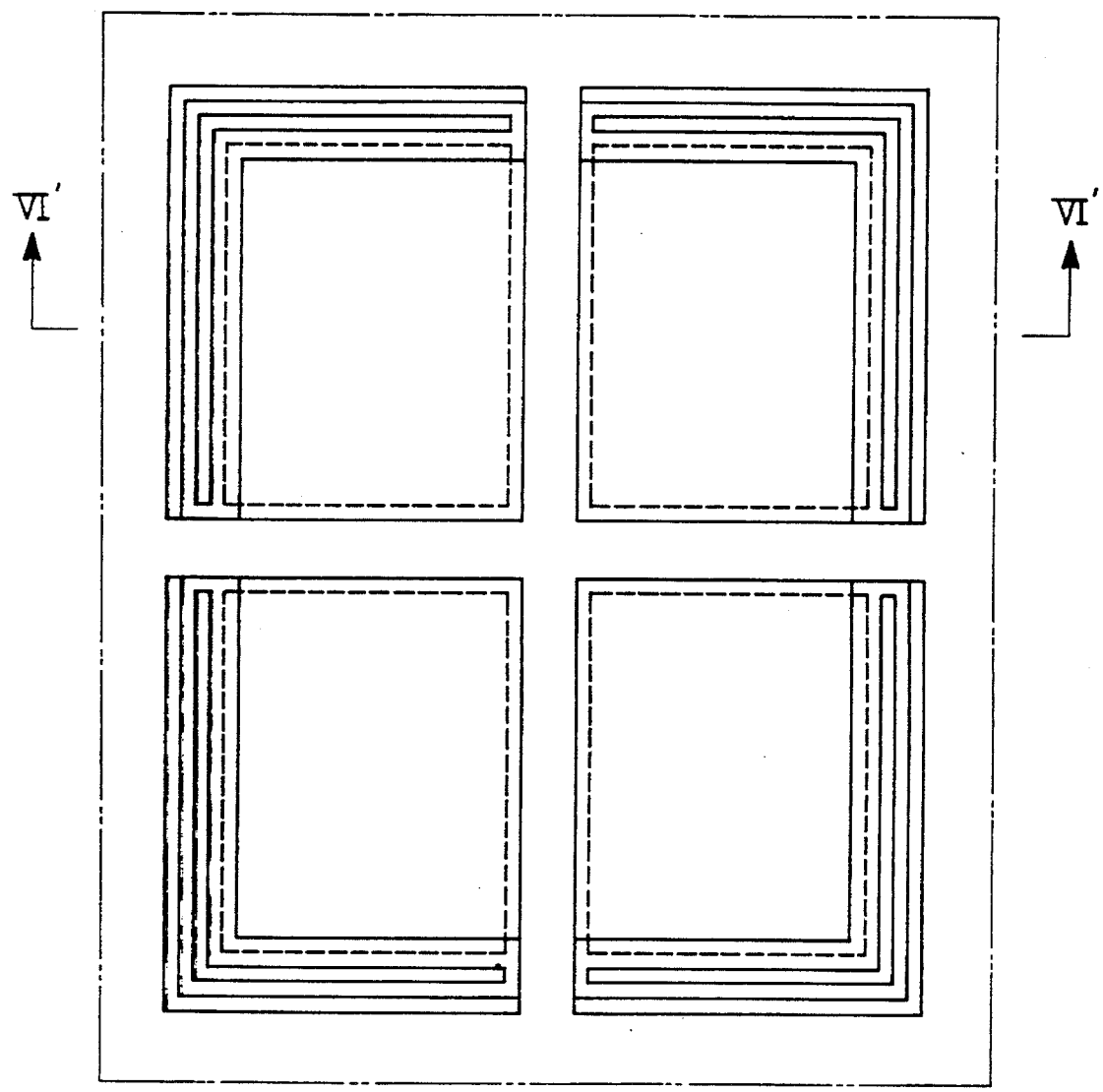
FIG. 7 is a plan view of a fourth embodiment of the silicon APD of the present invention.
Figure 10:
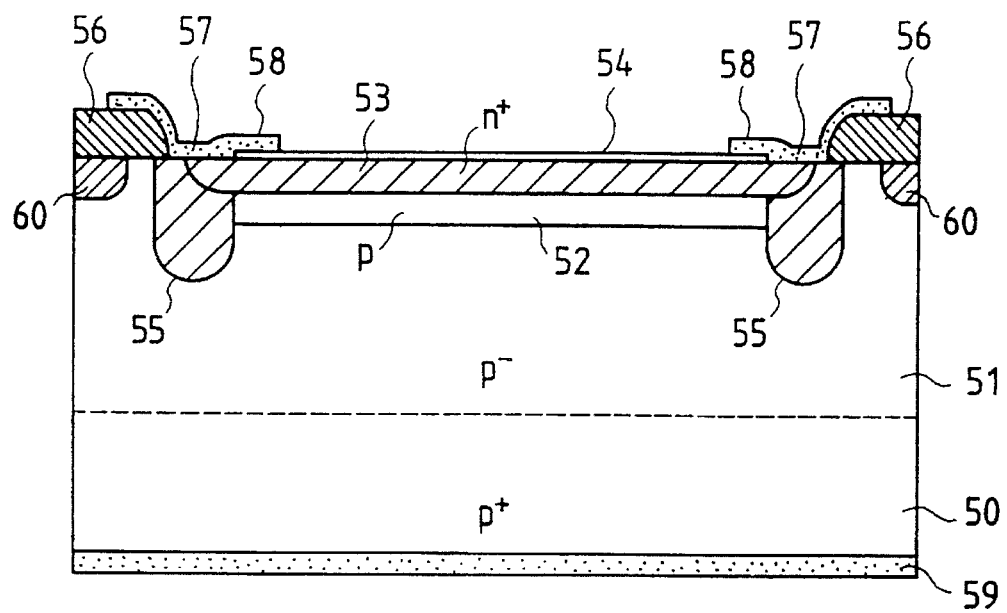
FIG. 10 is a cross-sectional view of a conventional silicon APD.

FIG. 7 illustrates a fourth embodiment of the silicon APD of the present invention, which is a four-divided silicon APD for ultraviolet light detection, provided with a photosensor array comprising four light-receiving areas. Also, in this fourth embodiment, as will be apparent from FIG. 7, the guard rings are formed only on the external periphery of the photosensor array but are not present in the area sandwiched between the mutually neighboring light-receiving areas. The cross-sectional structure along a line VI'—VI' in FIG. 7 is the same as that shown in FIG. 6, and will not, therefore, be explained further.

FIGS. 8 and 9 illustrate a fifth embodiment of the silicon APD of the present invention, which is a three-divided silicon APD for ultraviolet light detection, provided with a photosensor array comprising three light-receiving areas. Also, in this fifth embodiment, as will be apparent from FIG. 8, the guard rings are formed only at the external periphery of the photosensor array but are not present in the area between the mutually neighboring light-receiving areas. In FIGS. 8 and 9, the same or equivalent components as in FIGS. 5 and 6 are represented by the same reference numbers and will not be explained further.

The present invention has been explained by the preferred embodiments, but is not limited thereto. For example, in such ultraviolet-detecting silicon APD, the n$^+$-silicon substrate can have an impurity concentration equal to $1 \times 10^{17}$ cm$^{-3}$ or higher. Also, the n$^-$-layer need not be epitaxially grown as long as it has a thickness at least equal to 20 µm and an impurity concentration not exceeding $3 \times 10^{14}$ cm$^{-3}$. Also the n-layer can have an impurity concentration within a range from $1 \times 10^{16}$ cm$^{-3}$ to $2 \times 10^{16}$ cm$^{-3}$, and the p$^+$-layer can have an impurity concentration of $1 \times 10^{19}$ cm$^{-3}$ or higher.

Also, the divided silicon APD is not limited to the two-, three- or four-divided APD explained above but may be provided with a photosensor array comprising a larger number of light-receiving areas.

The distance of the mutually neighboring light-receiving areas is 14 µm in the embodiments shown in FIGS. 3 and 5, but the distance may be selected, for example, as 10 µm, if such pattern can be formed.

Therefore, it is intended that the invention not be limited to the preferred embodiments described herein, but that the invention will include all embodiments falling within the scope of the appended claims.

What is claimed is:

1. A silicon avalanche photodiode for detecting ultraviolet light, the silicon avalanche photodiode comprising a p$^+$-layer, an n-layer, an n$^-$-layer and an n$^+$-silicon substrate in order from an entrance side of the ultraviolet light, wherein said p$^+$-layer has a thickness at least equal to 0.7/α in which α is the absorption coefficient of silicon to the ultraviolet light.

2. A silicon avalanche photodiode comprising:
   a photosensor array having plural light-receiving areas arranged in a matrix; and
   a guard ring formed only at the external periphery of said photosensor array and overlapping an edge of each of the plural light-receiving areas.

3. A silicon avalanche photodiode according to claim 2, wherein an area present between mutually neighboring light-receiving areas in said photosensor array is a depletion layer during the function of the silicon avalanche photodiode.

4. A silicon avalanche photodiode for detecting ultraviolet light, the silicon avalanche photodiode comprising:
   a photosensor array having plural light-receiving areas arranged in a matrix, the photosensor array having a p$^+$-layer, an n-layer, an n$^-$-layer and an n$^+$-silicon substrate in order from an entrance side of the ultraviolet light, wherein said p$^+$-layer has a thickness at least equal to 0.7/α in which α is an absorption coefficient of silicon to the ultraviolet light; and
   a guard ring formed only at the external periphery of said photosensor array and overlapping an edge of each of the plural light-receiving areas.

5. A silicon avalanche photodiode according to claim 4, wherein an area present between mutually neighboring light-receiving areas in said photosensor array is a depletion layer during the function of the silicon avalanche photodiode.

6. A silicon avalanche photodiode comprising:
   a photosensor array having plural areas for receiving ultraviolet light, wherein said photosensor array includes
   an electrode layer,
   a silicon substrate layer formed on said electrode layer,
   an epitaxially grown layer formed on said silicon substrate layer,
   each of the plural areas formed in and at a surface of said epitaxially grown layer and spaced apart from an adjacent one of the plural areas by a depletion layer, and
   a plurality of diffusion areas formed respectively underneath said plural areas and in said epitaxially grown layer; and
   a guard ring formed only around a periphery of said photosensor array.

7. A silicon avalanche photodiode as claimed in claim 6, wherein:
   said silicon substrate layer has an n$^+$ conductivity;
   said epitaxially grown layer has an n$^-$ conductivity;
   each of said plural areas has a p$^+$ conductivity;
   each of said plurality of diffusion areas has an n conductivity; and
   each of said plural areas of p$^+$ conductivity has a thickness at least equal to 0.7/α, wherein α is an absorption coefficient of silicon to the ultraviolet light.

8. A silicon avalanche photodiode as claimed in claim 6, wherein:
   said silicon substrate layer has a p$^+$ conductivity;
   said epitaxially grown layer has a p$^-$ conductivity;
   each of said plural areas has an n$^+$ conductivity; and
   each of said plurality of diffusion areas has a p conductivity.

9. A silicon avalanche photodiode as claimed in claim 8, wherein said photosensor array further comprises channel cuts formed between adjacent ones of said plural areas.

* * * * *